United States Patent
Singer et al.

(10) Patent No.: US 6,867,923 B2
(45) Date of Patent: Mar. 15, 2005

(54) PROJECTION LENS, IN PARTICULAR FOR MICROLITHOGRAPHY

(75) Inventors: Wolfgang Singer, Aalen (DE);
Karl-Heinz Schuster, Koenigsbronn (DE)

(73) Assignee: Carl-Zeiss-Shiftung, Heidenheim (DE)

( * ) Notice: Subject to any disclaimer, the term of this patent is extended or adjusted under 35 U.S.C. 154(b) by 117 days.

(21) Appl. No.: 09/847,658

(22) Filed: May 2, 2001

(65) Prior Publication Data

US 2002/0008861 A1 Jan. 24, 2002

(30) Foreign Application Priority Data

May 4, 2000 (DE) .......................................... 100 21 739

(51) Int. Cl.[7] .......................... G02B 3/12; G03B 27/68
(52) U.S. Cl. ........................................ 359/667; 355/52
(58) Field of Search ............................... 359/649–651, 359/667, 754; 355/52, 53, 55

(56) References Cited

U.S. PATENT DOCUMENTS

| | | |
|---|---|---|
| 4,676,614 A | 6/1987 | Ohno |
| 4,676,631 A | 6/1987 | Kosugi et al. |
| 4,690,528 A | 9/1987 | Tanimoto et al. ........... 353/101 |
| 4,699,505 A | 10/1987 | Komoriya et al. |
| 4,780,747 A | 10/1988 | Suzuki et al. |
| 4,871,237 A | 10/1989 | Anzai et al. ................. 359/666 |
| 4,961,001 A | 10/1990 | Liegel et al. |
| 4,974,018 A | 11/1990 | Komoriya et al. |
| 5,025,284 A | 6/1991 | Komoriya et al. |
| 5,337,097 A | 8/1994 | Suzuki et al. |
| 5,852,490 A | 12/1998 | Matsuyama |
| 5,969,802 A | 10/1999 | Takahashi et al. |
| 6,235,438 B1 * | 5/2001 | Suzuki et al. ................. 430/30 |
| 6,333,776 B1 * | 12/2001 | Taniguchi .................... 355/52 |
| 2002/0033934 A1 | 3/2002 | Ishii ........................... 353/101 |
| 2003/0020888 A1 * | 1/2003 | Tanaka et al. ................ 355/30 |

FOREIGN PATENT DOCUMENTS

| | | |
|---|---|---|
| JP | 08241861 | 9/1996 |
| JP | 11297620 | 10/1999 |

OTHER PUBLICATIONS

International Search Report, 3 pgs., Mar. 18, 2004.

* cited by examiner

Primary Examiner—Georgia Epps
Assistant Examiner—William Choi
(74) Attorney, Agent, or Firm—Welsh & Katz, Ltd.

(57) ABSTRACT

A projection lens (3), in particular for microlithography, is provided with an object plane (7), with an image plane (9), with a lens arrangement (4) and with at least one gas chamber filled with gas or through which gas flows. The gas chamber is constructed as an approximately plane-parallel manipulation chamber (13). The refractive index can be varied in the manipulation chamber (13) by pressure changes and/or changes in gas composition.

26 Claims, 4 Drawing Sheets

PROJECTION LENS, IN PARTICULAR FOR MICROLITHOGRAPHY

BACKGROUND OF THE INVENTION

Figure 1:
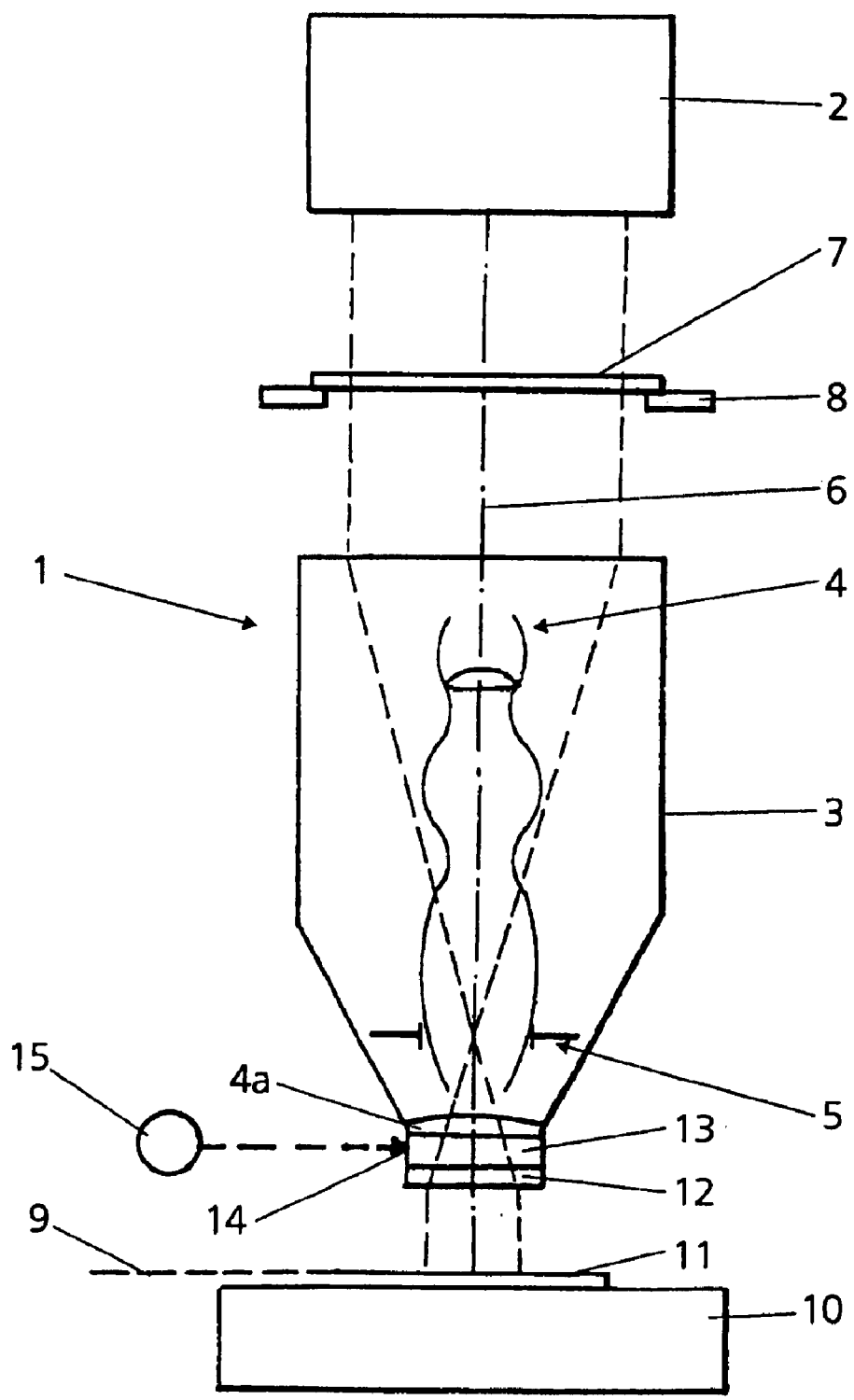

The invention relates to a projection lens, in particular for microlithography and having a lens arrangement, according to the type defined in more detail in the preamble of claim 1. The invention also relates to a method for producing microstructured components with the aid of a projection exposure machine.

It is already known from U.S. Pat. No. 4,871,237 to tune a lens as a function of barometric pressure, specifically via the refractive index of a filling gas in the lens interspace. It is possible, for example, to correct spherical aberration, coma and other faults by a suitable combination of interspaces. However, it is a disadvantage of this lens that other faults are initiated with the removal of one error, for example a spherical aberration.

U.S. Pat. No. 4,676,614 discloses a projection exposure machine which comprises a gas chamber to which pressure can be applied. Image errors caused by a change in atmospheric pressure can be compensated by a specific application of pressure.

U.S. Pat. No. 5,559,584 discloses introducing protective gas into the interspace between a wafer and/or a reticle and the projection lens in the case of a projection exposure machine for producing microstructured components.

In the case of lithographic lenses, spherical aberration, inter alia, arises as image error owing to environmental influences, such as change in air pressure, for example. Other parameters are lens heating and compaction, which likewise lead to spherical aberration. Particularly in the case of a high numerical aperture, the absolute value of the spherical aberration becomes very large and no longer tolerable given the required accuracies.

In addition to U.S. Pat. No. 4,871,237, mentioned at the beginning, it is known to compensate barometric and weather-induced pressure changes by wavelength changes in the case of DUV lenses. However, for 365 nm, 193 nm lenses this method no longer functions and specifically the chromatic correction of the lenses, that is to say the use of different materials, causes the different variation in the refractive indices with the wavelength to lead to image errors which cannot be tolerated.

It is also known from practice to compensate residual errors, caused by environmental influences, by using z manipulators, that is to say lens elements which can be actively displaced in the direction of the optical axis. However, it is disadvantageous of this method that in addition to the large outlay required therefore other errors are once again introduced thereby as well.

It is therefore common to all known methods that they more or less effectively compensate spherical aberration but at the same time once again introduce other errors, or act only incompletely. A complicating factor is added when the optical materials used, in particular lenses, consist of different materials such as, for example, calcium fluoride and quartz glass, because this gives rise to differently varying refractive indices over the wavelength, should it be desired to manipulate over the wavelength.

SUMMARY OF THE INVENTION

It is the object of the present invention to create a projection lens which has with fewer lenses a very good quality, in particular also in the case of a high aperture, it also being desirable to provide correction options at the same time. It is desired, in particular, to permit correction of the constant field component of a spherical aberration. It is likewise the object of the invention to create a method for producing microstructured components in the case of which spherical aberration can be corrected as far as possible.

Given parallel chambers and elements bounded by flat surfaces, only spherical aberration occurs in effective telecentric systems when there is a change in refractive index, in particular downstream and upstream of an end plate. This fact has now been utilized in the device according to the invention. Pressure changes in such a chamber change the spherical aberration. The same also holds for the change in a gas composition. This state of affairs is now utilized according to the invention for active manipulation for spherical aberration.

If, in this case, the manipulation chamber is disposed between a last end plate upstream of the substrate to be illuminated and the optical lens situated adjacent to the end plate, which in this case must be flat on the side facing the end plate, the spherical aberration produced "artificially" in this way can avoid or appropriately correct or compensate an aberration of the lens by changing the pressure in the manipulation chamber and/or the gas composition and/or the active control thereof.

The same also holds when the manipulation chamber is installed between the template and the image plane.

It is advantageous to set an offset of the refractive index in advance via a specific initial gas mixture, in order to permit changes in refractive index in both directions, that is to say raising and lowering it.

In other words, if the refractive index is changed in the manipulation chamber, spherical aberration (constant field characteristic) is introduced virtually exclusively. The change in the refractive index is achieved according to the invention by the selected composition of the gas or gas mixture to be introduced into the manipulation space, and/or of the pressure. In order not to introduce any new errors by additional pressure, for example by sagging of the surfaces delimiting the manipulation chamber, the elements closing off the manipulation chamber must correspond to the specified diameter/thickness ratios.

In a very advantageous development of the invention, it can be provided that a further manipulable gas interspace is provided in addition to the manipulation chamber. The further gas interspace can be provided with a low refractive power, that is to say at least one surface delimiting the gas interspace in the z direction is provided with a slight curvature. If a gas or a gas mixture is likewise introduced into this gas interspace, the refractive power can be varied by changing the gas mixture or else by a pressure change. It is possible in this way to change any field curvature arising on the substrate to be exposed. Specifically, imaging as accurately as possible on the flat substrate requires the absence of any field curvature. If, for example, the field curvature changes owing to lens warming, this disadvantageous field curvature can now be removed according to the invention by the further manipulable gas interspace. This holds, in particular, whenever the latter is situated as close as possible to the substrates to be exposed. At the same time, it is thereby avoided that other errors are produced again thereby.

The construction according to the invention of an optical element according to claim 8, which more or less has a shape which is at least approximately plane parallel, and the specified thickness, which is greater by comparison with known optical elements such as, for example, an end plate of a lens yield the advantage that, for example, owing to the plane parallelism of the optical element there is only an insubstantial variation in image errors arising from the thick element over the field. This element always reacts identically over the image field, because the lens is telecentric in this region. Since this optical element has no radii of curvature or at least none worth mentioning, no radii can exert an unfavorable influence in any way at all, in particular when the field increases or the aperture increases, for example. In other words: the optical element having the dimensions according to the invention no longer leads to any variations, and this means that specific aberrations in the widely opened lens can be better predicted in principle and can in this way be corrected further at the front or as early as in the input region.

When, in a very advantageous embodiment of the invention, it is provided that the optical element and a further optical element of the sixth optical group enclose a gas chamber, in which case it holds for the radius of curvature R3 of the surface of the second optical element, which faces the first lens, that: R3>3000 mm, preferably>5000 mm, this produces a quasi plane-parallel gas chamber which can be used as manipulation chamber in a very advantageous way for the invention.

A further, very advantageous and not obvious development of the invention in the use of an optical element in the sixth lens group with the specified radii of curvature and diameter/thickness ratios consists in that a lens with an aspheric is provided in the first lens cluster.

Corrections, such as the removal of shell errors and field curvature, for example, can be achieved with the aid of the aspheric according to the invention as early as in the input region of the lens. This holds, in particular, in the case of very widely opened lenses, in particular when the aspheric is fitted as near as possible to the input of the lens, at least in front of the first bulge, at best already on the first curved surface.

It is thereby possible according to the invention to achieve apertures of at least 0.75, preferably 0.85, it being possible, nevertheless, still to fit a very thick optical element on the output side, for example a thick end plate. Since an optical element in accordance with claim 1 no longer experiences variations, it is possible, for example, to predict the aberration, that is to say how it develops in the lens. The aspheric according to the invention can be used to influence and/or correct the aberration correspondingly. This can be done here in an advantageous way in a region in which the aperture is still relatively small.

The bundle of light can be even more effectively separated when the aspheric is arranged in front of the first light bulge.

According to the invention, the sixth optical group can consist only of plane-parallel plates. Of course, it is also possible to provide one or two lenses in the sixth optical group, in which case at least one lens should then have an at least approximately flat surface which is situated adjacent to a further plane-parallel surface, for example an end plate, so that the manipulation chamber according to the invention can then be formed therebetween.

It is also advantageous when lenses in the sixth lens cluster and, if appropriate, also in the fifth lens cluster, that is to say lenses which are situated nearest a wafer in microlithography, have only a positive refractive power. At least two or three appropriate lenses will preferably be arranged at this point.

Advantageous developments of the invention follow from the remaining subclaims and from the exemplary embodiments described below in principle with the aid of the drawing.

It is true that only purely refractive lenses are shown in the exemplary embodiments illustrated, but this invention is not limited to refractive systems, but can also read on catadioptric systems.

CONCISE DESCRIPTION OF THE DRAWINGS

Figure 2:
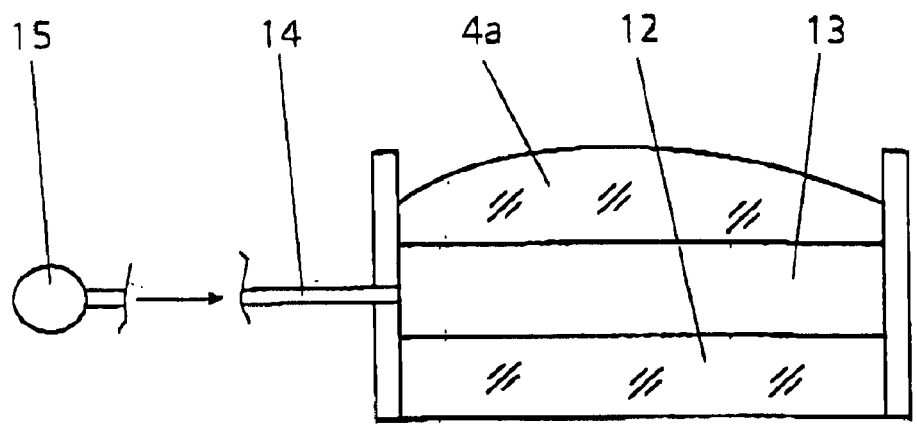
Figure 3:
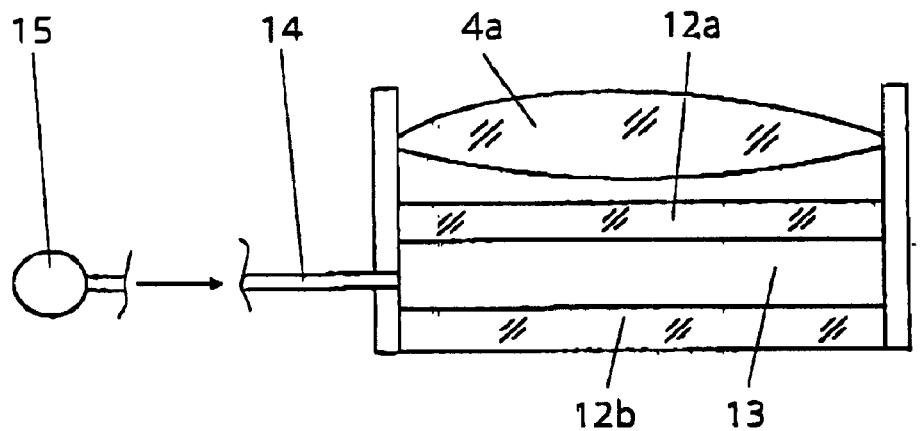
Figure 4:
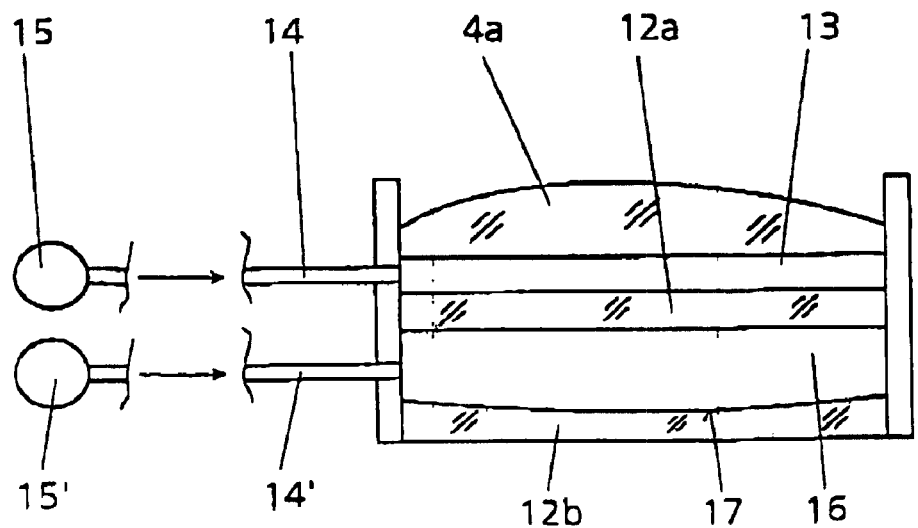
Figure 5:
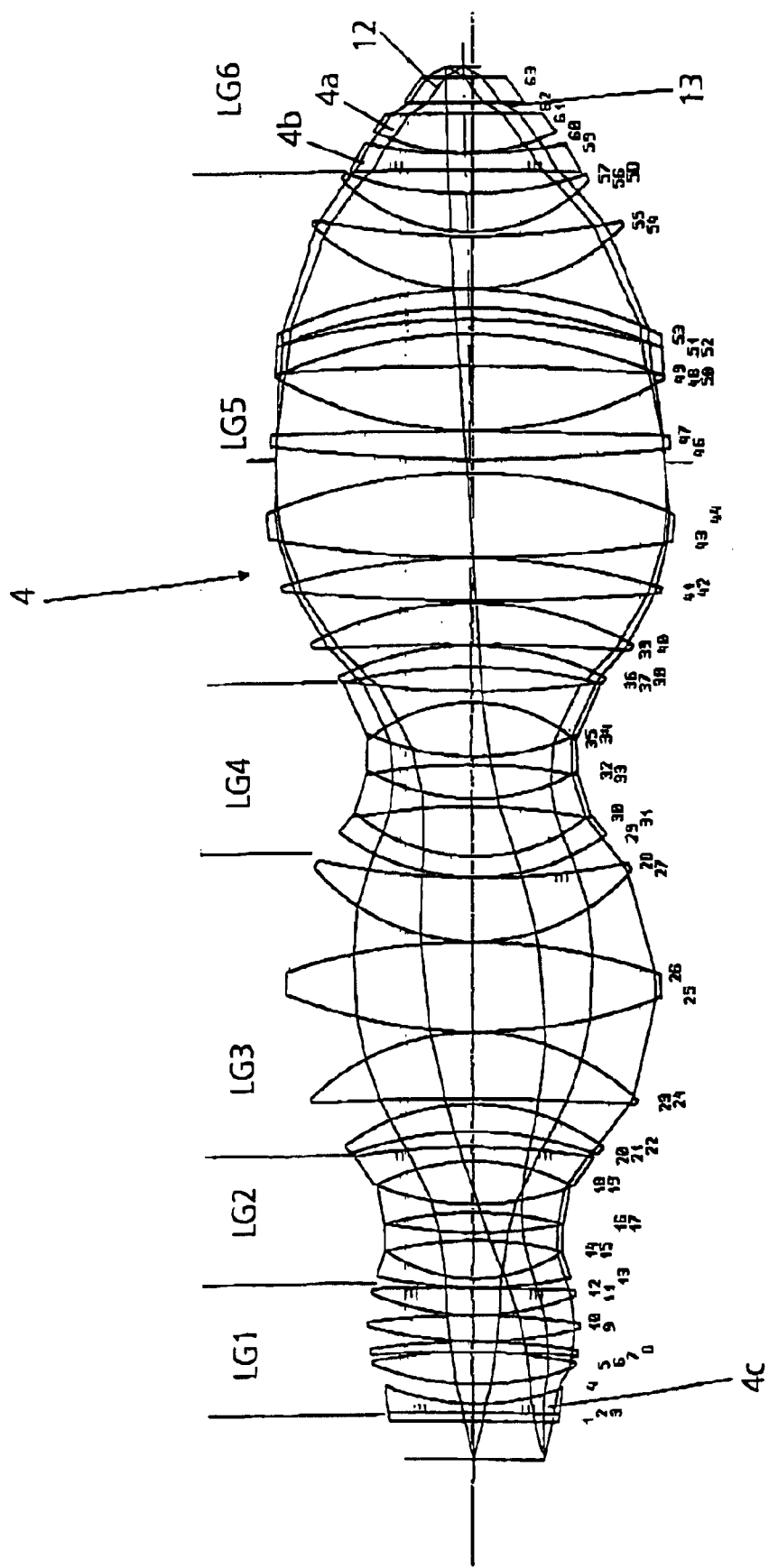
Figure 6:
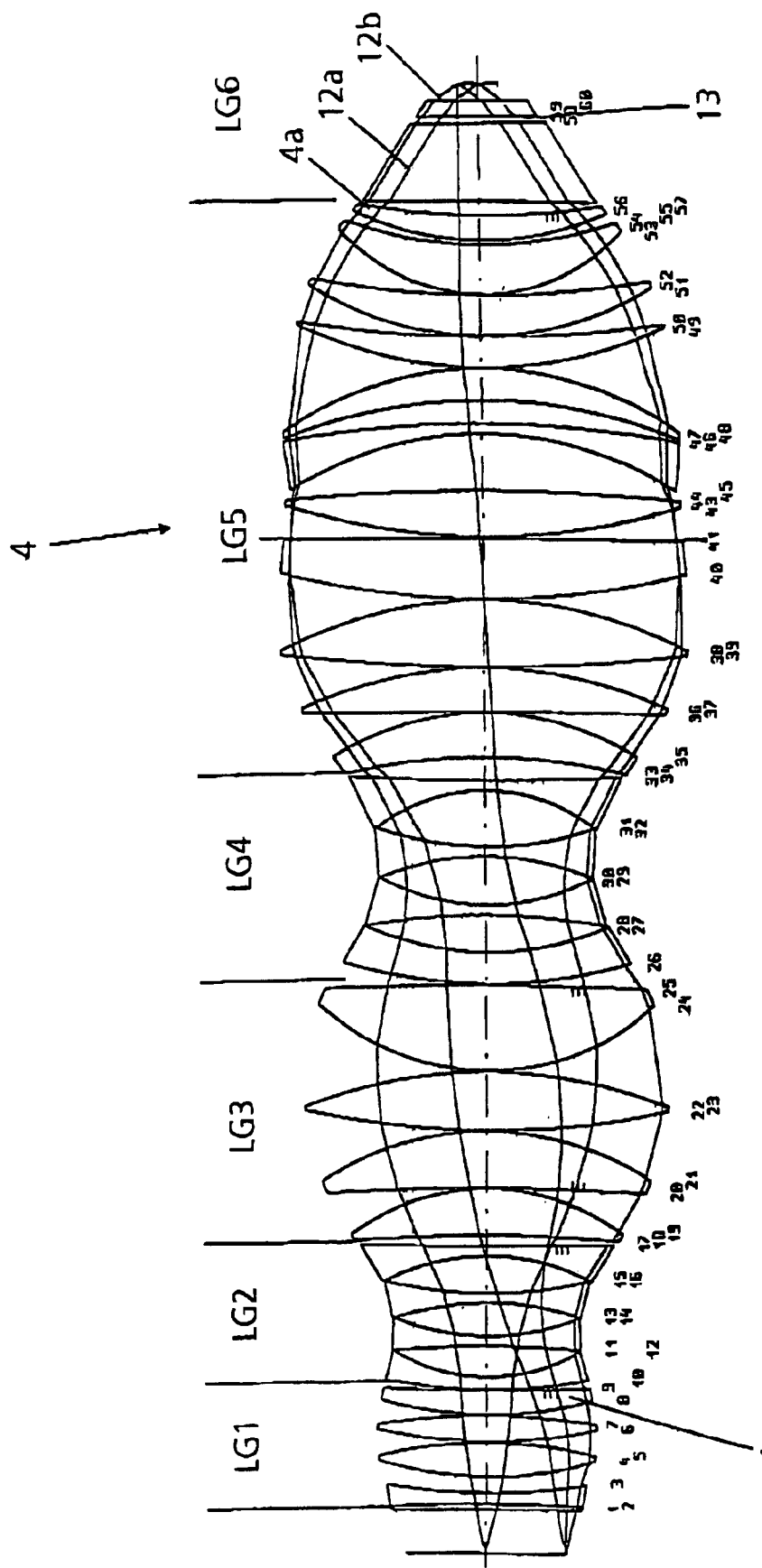

In the drawing:

FIG. 1 shows a diagrammatic illustration of a projection exposure machine according to the invention having a projection lens, FIG. 2 shows a section through the lower part of the projection lens having an end plate and a lens adjacent thereto with a manipulation chamber therebetween, in an enlarged representation, FIG. 3 shows a manipulation chamber which is formed by a bipartite end plate, in an enlarged representation, FIG. 4 shows an exemplary embodiment having a manipulation chamber and a further gas interspace, in an enlarged representation, FIG. 5 shows a lens section through a first lens arrangement, and FIG. 6 shows a lens section through a second lens arrangement.

DETAILED DESCRIPTION OF THE INVENTION

The principle of the design of a projection exposure machine 1 is described below with the aid of FIG. 1. The projection exposure machine 1 has an illuminating device 2 and a projection lens 3. The projection lens 3 comprises a lens arrangement 4 with a multiplicity of lenses and an aperture stop 5. The lenses 4a are arranged along an optical axis 6. A mask or reticle 7, which is held in the beam path by means of a mask holder 8, is arranged between the illuminating device 2 and the projection lens 3. The mask 7 is imaged on an image plane 9 by means of the projection lens 3 by a clearly reduced factor. Such mask 7 used in microlithography have a micrometer or nanometer structure which is imaged on the image plane 13 by means of the projection lens 3 in a fashion reduced in size down to a factor of 10, in particular the factor 4. The minimum structures which can still be resolved depend on the wavelength (of the light used for the illumination, and on the aperture of the aperture stop 5, the maximum achievable resolution of the projection exposure machine rising with decrease in the wavelength of the illuminating device 2 and with increasing aperture of the projection lens 3.

A substrate or a wafer 11 positioned by means of a substrate holder 10 is held in the image plane 9.

The determination of the projection lens 3 in tire direction of the wafer 11 forms a flat end plate 12. A last lens 4a of the lens arrangement 4 is located at a spacing from the end plate 12. A manipulation chamber 13, which is sealed off from the surrounding parts, is thereby created between the end plate 12 and the last lens 4a. As may be seen, the side of the last lens 4a facing the end plate 12 is likewise flat, the result being to surrender the manipulation chamber 13 plane-parallel. Of course, it is not mandatory for the side of the last lens 4a facing the end plate 12 to be absolutely plane-parallel. Given appropriately large lens radii, for example with radii R>3000 mm, preferably>5000 mm, plane parallelism is likewise achieved, as it were, and it is thereby possible to influence the production of the spherical aberration in the manipulation chamber 13 accordingly.

The manipulation chamber 13 is provided with a pressure connection 14 via which it can be connected to a gas source (not illustrated in more detail) (see also enlarged illustration in FIG. 2).

By changing the gas composition, which is introduced into the manipulation chamber 13 starting from the gas source 15, and/or a pressure change, changes in refractive index are introduced into the projection lens 3, specifically shortly ahead of the outlet, and so no further imaging errors can be introduced any more. Changing the refractive index creates a spherical aberration which is used to compensate a spherical aberration occurring in the projection lens 3, or else to manipulate it in a desired direction.

Instead of a manipulation chamber between the end plate 12 and the last lens 4a adjacent thereto, it is also possible to achieve a plane-parallel manipulation chamber by dividing the end plate 12 into two. In this case, the two end plate parts 12a and 12b are arranged at a spacing from one another and form the manipulation chamber 13 between their plane-parallel surfaces. Of course, it is necessary in this case for the two end plate parts to be constructed with an appropriate thickness so that no bending occurs (see FIG. 3). A ratio of thickness d1 to diameter DU1 of 1:5, preferably 1:3 should be observed for this reason.

FIG. 4 shows an embodiment having an additional gas interspace 16 as well as the manipulation chamber 13. In order to achieve as high an efficiency as possible for the manipulator, the gas interspace 16 is arranged as near as possible to the wafer 11 such that in this case the manipulation chamber 13 lies correspondingly further to the rear. The gas interspace 16 is likewise created in this case by splitting the end plate 12 into two into the two plate parts 12a and 12b. The interspace 16 is likewise connected to a gas source 15' via a dedicated pressure connection 14'. By contrast with the manipulation chamber 13, however, at least one of the two surfaces situated transverse to the z direction is provided with a slight curvature 17.

If it is known that the projection lens is used at a specific barometric elevation, the following procedure is recommended: Location of use, for example, at an elevation of 1700 meters with correspondingly reduced or increased air pressure by comparison with the lens manufacturer. When the lens is being tuned at the manufacturers, which is located, for example, at sea level or another lower elevation than that of the locations of use, the manipulation chamber is provided with a specifically set gas mixture whose refractive index is higher by the refractive index caused by the pressure difference than that at the location of use. In this way, the manipulation chamber can easily be filled later at the location of use with a conventional filling gas, for example synthetic air, oxygen, nitrogen or helium, at the average pressure at the installation site, and this results in an exactly tuned lens. Natural weather-induced changes in air pressure are now compensated by small pressure changes in the manipulation chamber. The advantage of this method consists in that the customer need only fill the manipulation chamber with conventional filling gas, and only slight pressure differences need be set.

If it is not desired to stipulate where the later location of use should be, the conventional filling gas is used for tuning. However, it is then later necessary to use a gas mixture of higher refractive index at the location of use if the barometric level rises. However, in this case pressure changes owing to the weather are likewise compensated by small changes in the gas pressure in the manipulation chamber.

Sections through the lens arrangements are illustrated by the examples in FIGS. 5 and 6.

The exemplary embodiments relate to a projection lens 3 having a lens arrangement 4 which is subdivided into six optical groups (LG1 to LG6). The first, third and fifth lens groups have a positive refractive power, and the second and fourth lens groups respectively have a negative refractive power. The subdivision of the lens system into lens groups is set forth below in more detail, the basis having been provided as the directional propagation of the rays.

The first lens group LG1 is positive and terminates with a lens of positive refractive power. The first lens cluster forms a bulge, it being immaterial whether negative lenses are also arranged in the bulge.

The second lens group LG2 has an overall refractive power which is negative. This second lens group LG2 has as first lens a lens constructed on the image side with a concave lens surface. This second lens group LG2 essentially describes a waist. It is not important here, either, whether individual positive lenses are contained in the second lens group LG2, as long as the waist is maintained.

The third lens group LG3 begins with a lens of positive refractive power which has on the image side a convex lens surface, and can be a meniscus. If a thick meniscus lens is provided as first lens, the separation of the lens groups can be conceived inside the lens.

The fourth lens group LG4 has a negative refractive power. This fourth lens group begins with a lens having a negative refractive power which is followed by a plurality of lenses with a negative refractive power. This lens group forms a waist. It is immaterial whether lenses having a positive refractive power are also arranged inside this lens group, as long as this influences the optical path only at a short distance, and so the waist shape of the fourth lens group is maintained.

The fifth lens group LG5 has an overall refractive power which is positive. The first lens of this fifth lens group LG5 has a convex lens surface on the image side. The fifth lens group LG5 forms a bulge.

The lens with the maximum diameter (the bulge), is followed by a further two positive lenses in the fifth lens group LG5, negative lenses also being permissible. The last lens of the fifth lens group LG5 has a concave lens surface on the image side.

The sixth optical group LG6 comprises the optical elements downstream of the fifth lens group up to the image plane.

Such projection lenses are used, in particular, in microlithography. They are known, for example, from DE 199 42 281 A, DE 198 55 108 A, DE 198 55 157 A and DE 198 55 158 A of the applicant and the prior art quoted there. These documents are also intended to be contained in this application.

These lenses in the first and sixth groups conventionally have air clearances which are delimited by a curved surface up to the air clearance between the object plane and first optical surface, and the air clearance between the last optical surface and image plane, at least on one side.

FIGS. 5 and 6 are of similar basic design. In FIG. 5, the manipulation chamber 13 is formed between the end plate 12 and the lens 4a in accordance with the principle illustrated in FIG. 4.

In FIG. 6, the end plate is of bipartite construction, specifically having the parts 12a and 12b, and the manipulation chamber 13 is located therebetween, as may also be seen from the illustration of the principle in FIG. 3. A lens is no longer provided in the sixth group in the case of this exemplary embodiment.

A lens 4c having an aspheric can be provided in the first lens group LG1, it being possible for the aspheric to be arranged upstream of the first bulge in the light direction. The projection lens 3 preferably has a numerical aperture on both sides of at least 0.75, preferably 0.85.

A laser which outputs radiation of wavelength shorter than 250 nm can be used as light source for microlithography.

As the case may be, a pattern contained on the mask 11 is appropriately structured after the development of the light-sensitive layer in the case of the production of microstructure components in which the substrate 11 provided with a light-sensitive layer is exposed to ultraviolet laser light by means of the mask 7 and the projection exposure machine 1.

FIG. 5 shows the ability to implement a lithographic lens as regards a manipulable plane-parallel air clearance in the outgoing part of the wafer. It has not so far been known to provide such a thick plane-parallel air clearance and a thick plane-parallel plate in a lens opened widely in such a way.

Aberrations which have so far been corrected in the descending region of the third bulge should now predominantly be corrected in the region of first bulge, first waist, second bulge. It has been found that this even exhibits clearly corrective advantages when the optical system is terminated with a thick plane-parallel plate in the case of the highest aperture. Consequently, this method was taken further where the thickness of the thick plate is clearly increased. In this case, the ratio of thickness to diameter should be at least 1:5. (The two plates act optically like a single thick plate.)

FIG. 6 shows a design having a particularly thick plane-parallel plate. It constitutes the solution for three further problems at once.

Very high sine i loadings in the region upstream of the wafer are obtained when correcting highly opened lithographic lenses. The curvatures which the individual lenses can now assume, as a sphere, now cause aberrations with a much different effect between the edge and middle of the image field (including above the aperture). These are frequently effects which are searched for in the lens and which are particularly provided. Here, in the case of large yields and very high apertures, they can, however, become unmanageable, or certainly at least disturb the correction. The solution now actually constitutes a very thick plane-parallel plate which supplies the desired contribution from spherical overcorrection, but now acts in a completely isoplanatic fashion with reference to the image field. Aperture and image field can now be made very large.

In addition to the corrective advantage, it is also possible to reduce the number of lenses by collecting them to form a thick plane-parallel plate. The number of lens surfaces with a very high angular loading such as is usual upstream of the wafer thereby decreases. The advantages are low costs and less reflection losses, and thus a higher transmission. This is important, in particular, for wavelengths of 157 nm and 193 nm. A further aspect is that the thick plate can substantially simplify the number of mounting parts in a region where there is little space, as is known. Located upstream of the wafer are the most varied image detection sensors which closely adjoin the actual lithographic optical system. The thick plane-parallel plate also creates the possibility here of accommodating more aperture and/or more field within a specific design space. This is also to be seen in that it is then possible, for example, to use the same sensor system for a further generation longer.

A thick plate or thick plates upstream of the wafer are therefore the solution according to the invention for a pressure manipulator upstream of the wafer in the lens, improved possibility for correction in conjunction with a very high aperture and large field, more aperture and field in conjunction with a given design space, and fewer highly loaded surfaces, more transmission.

In the exemplary embodiment according to FIG. 5, on the first curved surface, an aspheric surface takes over tasks which many lenses just upstream of the wafer have partly also taken over. However, the advantage here is now the extremely low angular loading on the first curved surface. At the same time, because of the good bundle separation it is possible to set a very specific effect with reference to the action between the middle of the image, the zone of the image field and the edge of the image field.

In microlithography, it is also possible in principle to provide a plane-parallel manipulation chamber between a last end plate of a projection lens and a wafer in which the refractive index can be varied by pressure changes and/or changes in gas composition. For this purpose, the interspace between the end plate and the wafer is to be purged with purging gas of appropriate composition and at an appropriate pressure. It is also required in general for this purpose to ※ encapsulated ※ the entire projection lens.

The design arrangement for the lens arrangements illustrated in FIG. 5 and 6 are to be specified below in each case by way of example. Of course, the features made concrete with the aid of these exemplary embodiments and their combinations can be combined with one another.

Example according to FIG. 5:

Operating wavelength l=193.3 nm

Diameter of the image field=24.6 mm

Image-side numerical aperture NA=0.85

Image scale (=−0.25

Refractive index n(SIO2)=1.5603

Refractive index n(CAF2)=1.5014

| Surface | Radius | Aspheric | Thickness | Material | Diameter |
|---|---|---|---|---|---|
| OB | | | 32.000 | AIR | |
| 1 | ∞ | | 6.329 | SIO2 | 110.8 |
| 2 | ∞ | | 1.383 | HE | 112.5 |
| 3 | −1393.131 | A | 6.329 | SIO2 | 112.8 |
| 4 | 153.737 | | 14.539 | HE | 118.0 |
| 5 | 191.890 | | 23.775 | SIO2 | 135.0 |
| 6 | −359.189 | | 0.678 | HE | 136.5 |
| 7 | −827.276 | | 7.196 | SIO2 | 137.7 |
| 8 | −475.714 | | 0.678 | HE | 138.8 |
| 9 | 296.346 | | 18.036 | SIO2 | 141.7 |
| 10 | −561.014 | | 0.678 | HE | 141.4 |
| 11 | 183.662 | | 19.090 | SIO2 | 137.2 |
| 12 | −16545.560 | A | 0.694 | HE | 135.1 |
| 13 | 326.464 | | 6.329 | SIO2 | 129.2 |
| 14 | 106.348 | | 27.957 | HE | 118.2 |
| 15 | −235.452 | | 6.329 | SIO2 | 117.5 |
| 16 | 304.109 | | 15.255 | HE | 118.0 |
| 17 | −232.751 | | 6.329 | SIO2 | 118.5 |
| 18 | 174.842 | | 33.179 | HE | 127.9 |
| 19 | −135.497 | | 10.857 | SIO2 | 132.8 |
| 20 | −567.373 | A | 11.495 | HE | 160.3 |
| 21 | −235.399 | | 21.176 | SIO2 | 165.8 |

-continued

| Surface | Radius | Aspheric | Thickness | Material | Diameter |
|---|---|---|---|---|---|
| 22 | −145.234 | | 4.213 | HE | 175.6 |
| 23 | −1890.770 | | 49.919 | CAF2 | 219.4 |
| 24 | −156.092 | | 0.678 | HE | 224.3 |
| 25 | 340.445 | | 66.046 | SIO2 | 255.5 |
| 26 | −383.246 | | 0.680 | HE | 254.8 |
| 27 | 137.326 | | 49.212 | CAF2 | 218.0 |
| 28 | 457.970 | A | 0.678 | HE | 209.9 |
| 29 | 147.683 | | 15.743 | SIO2 | 181.5 |
| 30 | 120.693 | | 37.797 | HE | 159.6 |
| 31 | −420.368 | | 6.329 | SIO2 | 159.6 |
| 32 | 139.505 | | 25.622 | HE | 140.7 |
| 33 | −378.597 | | 6.329 | SIO2 | 140.7 |
| 34 | 167.539 | | 39.624 | HE | 139.8 |
| 35 | −112.503 | | 8.239 | SIO2 | 139.8 |
| 36 | 504.607 | | 18.193 | HE | 174.3 |
| 37 | −369.374 | | 15.678 | SIO2 | 174.6 |
| 38 | −205.396 | | 1.373 | HE | 181.7 |
| 39 | −1692.687 | | 31.888 | CAF2 | 214.3 |
| 40 | −220.732 | | 1.536 | HE | 220.3 |
| 41 | 1213.241 | | 32.223 | CAF2 | 256.7 |
| 42 | −430.691 | | 0.692 | HE | 259.4 |
| 43 | 735.809 | | 63.006 | CAF2 | 274.9 |
| 44 | −355.045 | | 9.223 | HE | 278.5 |
| 45 | ∞ | | 0.633 | HE | 271.7 |
| AS | ∞ | | 0.000 | HE | 271.7 |
| 46 | 1056.085 | | 20.400 | CAF2 | 272.1 |
| 47 | −5047.421 | | 0.792 | HE | 271.5 |
| 48 | 260.901 | | 46.828 | CAF2 | 266.8 |
| 49 | −1697.534 | | 23.712 | HE | 264.5 |
| 50 | −317.482 | | 10.850 | SIO2 | 264.5 |
| 51 | −488.982 | | 8.402 | HE | 262.0 |
| 52 | −339.784 | | 13.562 | SIO2 | 262.0 |
| 53 | −295.518 | | 0.718 | HE | 261.9 |
| 54 | 152.565 | | 37.779 | CAF2 | 213.7 |
| 55 | 505.038 | | 3.020 | HE | 208.6 |
| 56 | 116.772 | | 28.279 | SIO2 | 168.9 |
| 57 | 258.363 | | 16.383 | HE | 160.8 |
| 58 | −5272.757 | A | 10.966 | SIO2 | 154.6 |
| 59 | 323.933 | | 0.897 | HE | 133.4 |
| 60 | 142.873 | | 27.124 | CAF2 | 121.2 |
| 61 | ∞ | | 8.137 | AIR | 102.4 |
| 62 | ∞ | | 18.083 | CAF2 | 76.0 |
| 63 | ∞ | | 12.000 | AIR | 51.1 |
| Im | | | | | |

In the aspherical formula:

$$z = \frac{\frac{1}{R}h^2}{1+\sqrt{1-(1-EX)\left(\frac{1}{R}\right)^2 h^2}} + \sum_{k=1} c_k h^{2k+2}$$

z is the sagitta; h is the height; R is the radius; EX is the eccentricity; and Ck is the ashperical constant.
ASPHERIC AT SURFACE 3
RADIUS=−1393.13098
EX=0.0000000000
C 1=0.4063752600E-07
C 2=0.2071817000E-11
C 3=−0.6785322600E-16
C 4 0.1029460700E-18
C 5=−0.2998039200E-22
C 6=0.3527081700E-26
ASPHERIC AT SURFACE 12
RADIUS=−16545.56046
EX=−43143.030000000
C 1=−0.4810999900E-07
C 2=0.4047924800E-11
C 3=−0.8963528600E-16
C 4 0.8505763100E-20
C 5=−0.2882210400E-23
C 6=0.5453287000E-27
ASPHERIC AT SURFACE 20
RADIUS=−567.37264
EX 0.0000000000
C 1=−0.3925583500E-08
C 2=−0.1562788800E-11
C 3=−0.1025893700E-16
C 4=−0.2599978800E-20
C 5=0.8906747700E-25
C 6=−0.3796689800E-28
ASPHERIC AT SURFACE 28
RADIUS=457.96974
EX=0.0000000000
C 1=0.6773315100E-08
C 2=−0.3998553500E-12
C 3=−0.1364056800E-16
C 4=−0.1474625900E-21
C 5=−0.2509622300E-25
C 6=0.1507291900E-29
ASPHERIC AT SURFACE 58
RADIUS=−5272.75688
EX=0.0000000000
C 1=−0.1963426400E-07
C 2=0.2768505300E-12
C 3=0.1262120200E-15
C 4=−0.1811119000E-19
C 5=0.1171493900E-23
C 6=−0.3104888900E-28
Example according to FIG. 6:
Operating wavelength l=248.4 nm
Diameter of the image field=27.2 mm
Image-side numerical aperture NA=0.8
Image scale β=−0.25
n(SIO2)=1.5084

| Surface | Radius | Aspheric | Thickness | Material | Diameter |
|---|---|---|---|---|---|
| OB | ∞ | | 32.000 | AIR | |
| 1 | ∞ | | 4.253 | AIR | 121.9 |
| 2 | −1143.702 | | 7.789 | SIO2 | 122.9 |
| 3 | 366.821 | | 11.482 | AIR | 127.5 |
| 4 | 249.157 | | 23.794 | SIO2 | 138.2 |
| 5 | −289.424 | | 0.750 | AIR | 139.4 |
| 6 | 329.633 | | 18.667 | SIO2 | 140.7 |
| 7 | −444.218 | | 0.750 | AIR | 140.2 |
| 8 | 268.864 | | 16.633 | SIO2 | 135.5 |
| 9 | 1167.441 | A | 0.750 | AIR | 131.9 |
| 10 | 360.081 | | 8.628 | SIO2 | 129.2 |
| 11 | 118.445 | | 21.270 | AIR | 120.1 |
| 12 | −775.270 | | 7.000 | SIO2 | 119.7 |
| 13 | 156.713 | | 23.965 | AIR | 118.8 |
| 14 | −190.304 | | 7.000 | SIO2 | 119.8 |
| 15 | 266.520 | | 27.800 | AIR | 131.4 |
| 16 | −141.408 | | 7.149 | SIO2 | 134.4 |
| 17 | 2327.162 | A | 7.878 | AIR | 162.8 |
| 18 | −999.626 | | 32.538 | SIO2 | 169.4 |
| 19 | −148.399 | | 0.750 | AIR | 177.5 |
| 20 | −1179.797 | A | 40.792 | SIO2 | 207.1 |
| 21 | −190.467 | | 0.750 | AIR | 215.0 |
| 22 | 506.448 | | 42.194 | SIO2 | 236.0 |
| 23 | −318.978 | | 0.750 | AIR | 236.6 |
| 24 | 156.565 | | 61.867 | SIO2 | 220.3 |
| 25 | −1909.591 | A | 0.750 | AIR | 209.4 |
| 26 | 305.588 | | 22.962 | SIO2 | 186.3 |
| 27 | 178.412 | | 27.808 | AIR | 157.7 |
| 28 | −441.206 | | 7.000 | SIO2 | 154.8 |
| 29 | 141.453 | | 34.534 | AIR | 138.2 |
| 30 | −176.778 | | 7.000 | SIO2 | 137.5 |
| 31 | 204.086 | | 40.524 | AIR | 141.8 |
| 32 | −114.660 | | 7.000 | SIO2 | 143.5 |
| 33 | 1254.417 | | 16.848 | AIR | 176.1 |

-continued

| Surface | Radius | Aspheric | Thickness | Material | Diameter |
|---|---|---|---|---|---|
| 34 | −386.520 | | 31.318 | SIO2 | 181.6 |
| 35 | −187.128 | | 0.750 | AIR | 198.8 |
| 36 | −7551.297 | | 32.372 | SIO2 | 235.1 |
| 37 | −271.610 | | 0.750 | AIR | 239.3 |
| 38 | 985.139 | | 48.181 | SIO2 | 264.8 |
| 39 | −280.307 | | 0.750 | AIR | 266.7 |
| 40 | 485.845 | | 42.861 | SIO2 | 265.0 |
| 41 | −19641.172 | | 0.750 | AIR | 260.0 |
| 42 | ∞ | | 0.750 | AIR | 259.6 |
| AS | ∞ | | 0.000 | AIR | 259.6 |
| 43 | 413.812 | | 31.899 | SIO2 | 258.5 |
| 44 | −1463.530 | | 41.090 | AIR | 257.1 |
| 45 | −229.000 | | 7.000 | SIO2 | 252.9 |
| 46 | −761.338 | | 16.518 | AIR | 258.2 |
| 47 | −346.924 | | 22.741 | SIO2 | 258.3 |
| 48 | −221.418 | | 0.750 | AIR | 260.0 |
| 49 | 265.978 | | 21.446 | SIO2 | 240.4 |
| 50 | 700.398 | | 0.750 | AIR | 238.8 |
| 51 | 203.760 | | 28.367 | SIO2 | 224.4 |
| 52 | 565.063 | | 0.750 | AIR | 219.8 |
| 53 | 124.657 | | 33.574 | SIO2 | 185.9 |
| 54 | 255.790 | | 3.089 | AIR | 175.4 |
| 55 | 192.512 | | 17.352 | SIO2 | 164.2 |
| 56 | 490.117 | A | 9.135 | AIR | 155.9 |
| 57 | ∞ | | 57.580 | SIO2 | 148.9 |
| 58 | ∞ | | 2.600 | AIR | 76.6 |
| 59 | ∞ | | 8.069 | SIO2 | 69.6 |
| 60 | ∞ | | 12.000 | AIR | 59.5 |
| IM | | | | | |

In the aspheric formula:

$$z = \frac{\frac{1}{R}h^2}{1+\sqrt{1-(1-EX)\left(\frac{1}{R}\right)^2 h^2}} + \sum_{k=1} c_k h^{2k+2}$$

z is the sagitta; h is the height; R is the radius; EX is the eccentricity; and Ck is the ashperical constant.

ASPHERIC AT SURFACE 9
RADIUS=1167.44078
EX=−148.8088700000
C 1=−0.3810274500E-07
C 2=0.1825110100E-11
C 3=0.8703118800E-16
C 4=−0.2547944400E-19
C 5=0.2618280200E-23
C 6=−0.7405173000E-28
ASPHERIC AT SURFACE 17
RADIUS=2327.16189
EX=−543.6641800000
C 1=0.1496899300E-07
C 2=−0.4053465300E-11
C 3=−0.3692162500E-16
C 4 .1322169800E-19
C 5=−0.7575130800E-24
C 6=−0.1121083700E-27
ASPHERIC AT SURFACE 20
RADIUS=−1179.79732
EX=88.7124390000
C 1=0.5780601700E-08
C 2=0.2633543200E-12
C 3=−0.3666325900E-16
C 4=0.793956500E-21
C 5=−0.7002646400E-26
C 6=0.4010891200E-29
ASPHERIC AT SURFACE 25
RADIUS=−1909.59064
EX=0.0000000000
C 1=0.5895489200E-08
C 2=0.4254414900E-13
C 3=−0.4954342300E-18
C 4=−0.9017812800E-21
C 5=0.3307499000E-25
C 6=−0.5028285900E-30
ASPHERIC AT SURFACE 56
RADIUS=490.11681
EX=−4.7440051000
C 1=0.6613898200E-08
C 2=−0.9371994200E-12
C 3=0.7675398100E-16
C 4=−0.9919946900E-20
C 5=0.9420632400E-24
C 6=−0.4092113200E-28

What is claimed is:

1. Projection lens, having an object plane, having an image plane, having a lens arrangement and having at least one gas chamber filled with gas or through which gas flows, wherein the gas chamber is constructed as an at least approximately plane-parallel manipulation chamber located between the lens arrangement and the image plane, and wherein the manipulation chamber is connected with pressure change means and has non-bending end plates.

2. Projection lens according to claim 1, wherein an end plate of the lens arrangement is bipartite, and wherein the end plates are arranged at a spacing from one another and form the manipulation chamber between them.

3. Projection lens, having an object plane, having an image plane, having a lens arrangement and having at least one gas chamber filled with gas or through which gas flows said gas being selected from the group consisting of Nitrogen, Oxygen and Helium and a mixture thereof, wherein the gas chamber is constructed as an at least approximately plane-parallel manipulation chamber located between the lens arrangement and the image plane, and wherein the manipulation chamber is connected with gas composition change means and has non-bending end plates.

4. Projection lens, having an object plane, having an image plane, having a lens arrangement and having at least one gas chamber filled with gas or through which gas flows said gas being selected from the group consisting of Nitrogen Oxygen and Helium and a mixture thereof, wherein the gas chamber is constructed as an at least approximately plane-parallel manipulation chamber located between the lens arrangement and the image plane, and wherein the manipulation chamber is connected with pressure change means and gas composition change means and has non-bending end plates.

5. Projection exposure machine in microlithography, having a light source which outputs radiation of wavelength shorter than 370 nm, where it comprises a projection lens according to claim 3 or 4.

6. System for projection lens, having an object plane, having an image plane, having a lens arrangement and having at least one gas chamber filled with gas or through which gas flows, wherein the gas chamber is a manipulation chamber formed between adjacent plane-parallel optical elements, having non-bending end plates and wherein the refractive index can be varied in the manipulation chamber by pressure changes.

7. System for projection lens according to claim 6, wherein the offset of the refractive index can be set via the pressure changes in such a way that the refractive index can be manipulated in both directions.

8. System for projection lens according to claim 6, wherein in addition to the manipulation chamber a further at least approximately plane-parallel manipulable gas interspace is provided, for the purpose of removing field curvature, on a substrate, which is to be exposed, in a sixth optical group.

9. System for projection lens having an object, having an image plane, having a lens arrangement and having at least one gas chamber filled with gas or through which gas flows, wherein the gas chamber is constructed as an at least approximately plane-parallel manipulation chamber, and further including an at least approximately plane-parallel manipulable gas interspace, for the purpose of removing field curvature, on a substrate, which is to be exposed, in the sixth optical group.

10. System for projection lens according to claim 9, wherein the offset of the refractive index can be set via the gas composition in such a way that the refractive index can be manipulated in both directions.

11. Method of producing microstructured components, in the case of which a substrate provided with a light-sensitive layer is exposed by ultraviolet light by means of a mask and a projection exposure machine according to claim 9, and is structured after the development of the light-sensitive layer in accordance with a pattern included on the mask.

12. System for projection lens, in particular for microlithography, having an object plane, having an image plane, having a lens arrangement and having at least one gas chamber filled with gas or through which gas flows said gas being selected from the group consisting of Nitrogen, Oxygen and Helium, wherein the gas chamber is constructed between adjacent approximately plane-parallel optical elements to form a manipulation chamber with non-bending end plates, and wherein the refractive index can be variesd in the manipulation chamber by pressure changes and changes in gas composition.

13. System for projection lens according to claim 12, wherein the offset of the refractive index can be set via the gas composition in such a way that the refractive index can be manipulated in both directions.

14. System for projection lens according to claim 12, wherein in addition to the manipulation chamber a further at least approximately plane-parallel manipulable gas interspace is provided, for the purpose of removing field curvature, on a substrate, which is to be exposed, in a sixth optical group.

15. A system according to claim 14, wherein provided in addition to the manipulation chamber is a further manipulable gas interspace, by means of which a field curvature on the substrate to be exposed can be removed.

16. Method for producing microstructured components, in the case of which a substrate provided with a light-sensitive layer is exposed to UV light by means of a mask and a projection exposure machine with a lens arrangement, and an approximately plane-parallel manipulation chamber having non-bending end plates and which is connected to a gas source, the gas being selected from a group consisting of Nitrogen, Oxygen, Helium and a mixture thereof and manipulating the refractive index by pressure changes and changes in gas composition.

17. Method according to claim 16, wherein the manipulation chamber is installed in the projection lens on the input side of the lens arrangement or on the side of the mask.

18. Method according to claim 16, wherein the manipulation chamber is installed on the output side of the lens arrangement or on the side of the wafer.

19. Method according to claim 16, wherein the manipulation chamber is installed between the lens arrangement and the image plane.

20. Method according to claim 16, wherein when the projection lens is being tuned a filling gas is introduced which is subsequently exchanged by the operator for a gas mixture.

21. Projection lens for microlithography, having an object plane, having an image plane, having a lens arrangement and having at least one gas chamber filled with gas or through which gas flows, wherein the gas chamber is a manipulation chamber formed between adjacent plane-parallel optical elements having non-bending end plates, and wherein the manipulation chamber is connected with pressure change means.

22. Projection lens for microlithography, having an object plane, having an image plane, having a lens arrangement and having at least one gas chamber filled with gas or through which gas flows, wherein the gas chamber is constructed between adjacent plane-parallel optical elements to form a manipulation chamber having non-bending end plates, the manipulation chamber being connected with gas composition change means.

23. Projection lens for microlithography, having an object plane, having an image plane, having a lens arrangement and having at least one gas chamber filled with gas or through which gas flows, wherein the gas chamber is constructed between adjacent approximately plane-parallel optical elements to form a manipulation chamber, the manipulation chamber being connected to pressure change means and gas composition change means and has non-bending end plates.

24. Projection lens, having an object plane, having an image plane, having a lens arrangement and having at least one gas chamber filled with gas or through which gas flows, wherein the gas chamber is constructed as an at least approximately plane-parallel manipulation chamber, said manipulation chamber having non-bending end plates and located in the lens arrangement and between an end plate and the lens situated adjacent to the end plate, and wherein the manipulation chamber is connected with pressure change means.

25. Projection lens, having an object plane, having an image plane, having a lens arrangement and having at least one gas chamber filled with gas or through which gas flows, wherein that the gas chamber is constructed as an at least approximately plane-parallel manipulation chamber having non-bending end plates located in the lens arrangement and between one of said end plates and the lens situated adjacent to the end plate, and wherein the manipulation chamber is connected with gas composition change means.

26. Projection lens, having an object plane, having an image plane, having a lens arrangement and having at least one gas chamber filled with gas or through which gas flows, wherein that the gas chamber is constructed as an at least approximately plane-parallel manipulation chamber having non-bending end plate located in the lens arrangement and between one of said end plate and the lens situated adjacent to the end plate, and wherein the manipulation chamber is connected with pressure change means and gas composition change means.

* * * * *

UNITED STATES PATENT AND TRADEMARK OFFICE
CERTIFICATE OF CORRECTION

PATENT NO.       : 6,867,923 B2
APPLICATION NO.  : 09/847658
DATED            : March 15, 2005
INVENTOR(S)      : Singer et al.

It is certified that error appears in the above-identified patent and that said Letters Patent is hereby corrected as shown below:

column 4, line 56:
"....in tire direction ...." should read --....in the direction.... -- column 8, line 32:

" ❈ encapsulated ❈ " should read --encapsulate-- column 8, line 42:
"....Image scale (=...." should read --.... Image scale β=....-- column 11, line 54:
"C- 4 .1322169800E-19" should read --C 4=0.1322169800E-19-- column 11, line 65:
"C 6=0.401891200E-29" should read --C 6=-0.4010891200E-29--

Claim 5, Column 12, Line 53:
"....according to claim 3 or 4." should read --.... according to claim 1, 3 or 4.--

Claim 11, column 13, line 20
".... is exposed by ultraviolet light ...." should read --.... is exposed to ultraviolet light ,,,,--

Claim 12, column 13, line 32
"....can be variesd ...." should read --.... can be varied.--

Signed and Sealed this

Twenty-first Day of November, 2006

JON W. DUDAS
*Director of the United States Patent and Trademark Office*